(12) United States Patent
Fulford et al.

(10) Patent No.: US 11,990,334 B2
(45) Date of Patent: May 21, 2024

(54) METHOD FOR TUNING STRESS TRANSITIONS OF FILMS ON A SUBSTRATE

(71) Applicant: Tokyo Electron Limited, Tokyo (JP)

(72) Inventors: Daniel Fulford, Ballston Lake, NY (US); Jodi Grzeskowiak, Schenectady, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 12 days.

(21) Appl. No.: 16/922,809

(22) Filed: Jul. 7, 2020

(65) Prior Publication Data

US 2021/0020435 A1 Jan. 21, 2021

Related U.S. Application Data

(60) Provisional application No. 62/876,372, filed on Jul. 19, 2019.

(51) Int. Cl.
*H01L 21/306* (2006.01)
*H01L 21/02* (2006.01)
(Continued)

(52) U.S. Cl.
CPC .... *H01L 21/02304* (2013.01); *H01L 21/0217* (2013.01); *H01L 21/31053* (2013.01); *H01L 21/31111* (2013.01)

(58) Field of Classification Search
CPC ............ H01L 21/31055; H01L 21/30604
See application file for complete search history.

(56) References Cited

U.S. PATENT DOCUMENTS 5,350,485 A * 9/1994 Shiraishi ............ H01L 21/0277
430/323
5,933,748 A * 8/1999 Chou ................ H01L 21/76237
438/692

(Continued)

FOREIGN PATENT DOCUMENTS

JP 2003-257950 A 9/2003
JP 4325471 B2 9/2009

(Continued)

OTHER PUBLICATIONS

International Search Report and Written Opinion dated Oct. 28, 2020 in PCT/US2020/042356, citing documents AA, AO through AR therein, 9 pages.

(Continued)

*Primary Examiner* — Thomas T Pham
(74) *Attorney, Agent, or Firm* — Oblon, McClelland, Maier & Neustadt, L.L.P.

(57) ABSTRACT

The disclosure relates to a method for tuning stress transitions of films on a substrate. The method includes forming a stress-adjustment layer on the substrate, wherein the stress-adjustment layer includes first regions formed of a first material and second regions formed of a second material, wherein the first material includes a first internal stress and the second material includes a second internal stress, and wherein the first internal stress is different compared to the second internal stress; and forming transition regions between the first regions and the second regions, wherein the transition regions include an interface between the first material and the second material that has a predetermined slope that is greater than zero degrees and less than 90 degrees.

15 Claims, 9 Drawing Sheets

(51) Int. Cl.
*H01L 21/3105* (2006.01)
*H01L 21/311* (2006.01)

(56) References Cited

U.S. PATENT DOCUMENTS

| | | | |
|---|---|---|---|
| 6,245,604 B1* | 6/2001 | Violette | H01L 21/8249 |
| | | | 438/203 |
| 6,617,690 B1 | 9/2003 | Gates et al. | |
| 9,396,958 B2 | 7/2016 | Metz et al. | |
| 2001/0015810 A1* | 8/2001 | Hara | G01N 21/3504 |
| | | | 359/578 |
| 2003/0143484 A1* | 7/2003 | Rottstegge | G03F 7/405 |
| | | | 430/905 |
| 2005/0179137 A1* | 8/2005 | Usami | H01L 23/5329 |
| | | | 257/761 |
| 2009/0026548 A1* | 1/2009 | Song | H01L 29/7843 |
| | | | 257/369 |
| 2012/0145668 A1* | 6/2012 | Riege | G03F 1/38 |
| | | | 430/326 |
| 2016/0104628 A1 | 4/2016 | Metz et al. | |
| 2016/0260611 A1 | 9/2016 | Consiglio et al. | |
| 2018/0040474 A1 | 2/2018 | Zi et al. | |
| 2018/0174830 A1* | 6/2018 | Wang | G03F 7/405 |
| 2018/0217497 A1 | 8/2018 | Yoshino et al. | |
| 2019/0006465 A1* | 1/2019 | Liao | H01L 29/785 |

FOREIGN PATENT DOCUMENTS

| | | |
|---|---|---|
| KR | 10-2017-0070149 A | 6/2017 |
| KR | 10-2018-0041182 A | 4/2018 |

OTHER PUBLICATIONS

Taiwanese Office Action issued Feb. 26, 2024, in Taiwanese Patent Application No. 109124230, 8 pages.

* cited by examiner

101

102

103

Without CAP Slope Setting, binary control of stress

METHOD FOR TUNING STRESS TRANSITIONS OF FILMS ON A SUBSTRATE

CROSS-REFERENCE TO RELATED APPLICATIONS

This present disclosure claims the benefit of U.S. Provisional Application No. 62/876,372, filed on Jul. 19, 2019, which is incorporated herein by reference in its entirety.

TECHNICAL FIELD

The present disclosure relates to a method of fabrication of semiconductor devices and more particularly to a method for tuning stress transitions of films on a substrate.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with an illumination field, such as a rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a method of adjusting stress on a substrate. The method includes depositing a first layer of a first material on the substrate; depositing a second layer of a second material on the first layer; changing a solubility of the second layer at one or more coordinate locations on the substrate, wherein the solubility of the second layer is changed in solubility from a top surface of the second layer down to a predetermined depth into the second layer at each of the one or more coordinate locations, and wherein changing the solubility of the second layer includes creating a transition region defining a predetermined slope of solubility change across the transition region; and removing soluble portions of the second layer using a developer such that remaining portions of the second layer include the predetermined slope in the transition region from a first z-height of the second layer to a second z-height of the second layer, wherein the first z-height of the second layer is less than the second z-height of the second layer.

According to an aspect, the method further includes executing an etch process that simultaneously etches the first material and the second material transferring the predetermined slope into the first layer.

According to another aspect, the method further includes depositing a third material on the substrate resulting in a planar surface of the substrate, the third material filling regions of the substrate to a greatest z-height of the first layer.

In an example, changing the solubility of the second layer includes creating a second transition region defining a second predetermined slope of solubility change across the second transition region.

According to yet another aspect, the method further includes depositing a third material on the substrate resulting in a planar surface of the substrate, the third material filling regions of the substrate to a greatest z-height of the second layer.

According to yet another aspect, the method further includes depositing a third material on the substrate; and planarizing the substrate to remove an overburden of the third material, the third material having the predetermined slope in the transition region.

In an example, creating the transition region defining the predetermined slope of solubility change is based on a desired stress transition for the transition region.

According to yet another aspect, the method further includes depositing a third material on the substrate, the third material filling regions of the substrate having a lesser z-height; depositing a fourth material on the substrate, the fourth material filling regions of the substrate having a lesser z-height; and planarizing the fourth material by changing a solubility of the fourth material at locations of relatively greater z-height, and removing soluble portions of the fourth material using a developer.

In an example, the first material has a different internal stress as compared to the second material.

In another example, the first material has a different internal stress as compared to the third material.

In yet another example, the predetermined slope is selected based on a design stress transition.

In yet another example, the first layer and the second layer are deposited on a backside surface of the substrate opposing a front side surface of the substrate, the front side surface of the substrate including semiconductor devices.

Aspects of the disclosure also provide another method of adjusting stress on a substrate. The method includes depositing a first layer of a first material on the substrate; changing a solubility of the first layer at one or more coordinate locations on the substrate, wherein the solubility of the first layer is changed in solubility from a top surface of the first layer down a predetermined depth into the first layer at each of the one or more coordinate locations, and wherein changing the solubility of the first layer includes creating a transition region defining a predetermined slope of solubility change across the transition region, the predetermined slope being greater than zero degrees and less than 90 degrees; and removing soluble portions of the first layer using a specific developer such that remaining portions of the first layer include the predetermined slope in the transition region from a first z-height of the first layer to a second z-height of the first layer, wherein the first z-height of the first layer is less than the second z-height of the first layer.

According to an aspect, the method further includes depositing a second layer of a second material on the substrate, the second material forming an interface with the first material having the predetermined slope, the second material and the first material having different internal stresses.

Aspects of the disclosure also provide yet another method of adjusting stress on a substrate. The method includes forming a stress-adjustment layer on the substrate, wherein the stress-adjustment layer includes first regions formed of a first material and second regions formed of a second material, wherein the first material includes a first internal stress and the second material includes a second internal stress, and wherein the first internal stress is different compared to the second internal stress; and forming transition regions between the first regions and the second regions, wherein the transition regions include an interface between the first material and the second material that has a predetermined slope that is greater than zero degrees and less than 90 degrees.

In an example, the predetermined slope is greater than 15 degrees and less than 75 degrees.

According to an aspect, the method further includes forming transition regions of different interface slopes based on a coordinate location on the substrate.

In an example, the first internal stress is a compressive stress, and the second internal stress is a compressive stress.

In another example, the first internal stress is a tensile stress, and the second internal stress is a tensile stress.

In yet another example, the first internal stress is a compressive stress, and the second internal stress is a tensile stress.

In yet another example, the first internal stress is a tensile stress, and the second internal stress is a compressive stress.

In yet another example, the first material and the second material have a same molecular composition and different internal stresses.

Note that this summary section does not specify every aspect and/or incrementally novel aspect of the present disclosure or the claimed subject matter. Instead, this summary only provides a preliminary discussion of different aspects and corresponding points of novelty. For additional details and/or possible perspectives of the disclosure and aspects, the reader is directed to the Detailed Description section and corresponding figures of the present disclosure as further discussed below.

BRIEF DESCRIPTION OF THE DRAWINGS

The accompanying drawings, which are incorporated in and constitute a part of this specification, illustrate aspects consistent with the disclosure and, together with the description, serve to explain the principles of the disclosure.

Figure 1:
FIG. 1 shows a cross-sectional formation during one of a plurality of steps of a stress tuning process according to an exemplary aspect of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects.

DETAILED DESCRIPTION

The following disclosure provides many different aspects, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include aspects in which the first and second features are formed in direct contact, and may also include aspects in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various aspects and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

As semiconductor device fabrication technology advances, there are increasing demands on photolithography systems and coaters/developers used to manufacture the semiconductor devices. This includes increasing demands on the accuracy of substrate alignment. A substrate is typically mounted on a chuck, also referred to as a wafer table. During exposure, the features being exposed on the substrate need to overlay existing features on the substrate. In other words, Pattern B needs to be aligned with Pattern A. The alignment of subsequent layers is known as overlay. An error in overlay means that a layer is offset with respect to a layer below (or above) it. To achieve desired overlay performance, the substrate is aligned to the substrate stage prior to exposure. Any movement of the substrate relative to the substrate stage after alignment, however, can result in overlay errors. Conventional tools already exist to measure overlay error, such as by using scatterometers.

Various fabrication process steps (material deposition, etching, curing, et cetera) can cause expansion and/or contraction of the substrate, resulting is a warped or bowed substrate. For example, during exposure of actinic radiation, a substrate is heated locally due to the energy transferred to the substrate from an exposure beam. Substrates are also heated during anneal processes. This heating causes the substrate to expand. If the substrate expansion is unchecked, the expansion exceeds overlay error tolerances. Moreover, if the clamping force between the substrate and the substrate chuck is not sufficient to prevent substrate expansion, then the substrate can slip on the substrate chuck and larger substrate expansion will occur, resulting in larger overlay errors. Slipping can be more pronounced in some processes, such as in extreme ultraviolet ("EUV") systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height differences (differences in vertical heights or distances perpendicular to a substrate surface) that have both high spots and low spots. Height differences due to such bowing can be on the order of about one micron to approximately 500 microns or more. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield as it is difficult to properly align two patterns.

Various techniques used to address substrate bow and uneven curvature on partially-processed substrates focus on chucking techniques to chuck (or clamp or suck) a substrate to a substrate holder to flatten curvature. With such significant bowing, however, it can be very difficult or impossible to accurately flatten a substrate by chucking a substrate alone. Thus, it is desirable to have a substrate overlay correction technique to improve and/or correct overlay prior to being sent or returned to a scanner/stepper for additional exposures.

Wafer overlay can be corrected or improved by measuring a bow of a substrate to map z-height deviations on the substrate, then an overlay correction pattern is generated that defines adjustments to internal stresses at specific locations on the substrate based on the initial bow measurement of the substrate. In this overlay correction pattern, a first given location on the substrate has a different internal stress adjustment defined as compared to a second given location on the substrate in the overlay correction pattern. Internal stresses on the substrate are then modified at specific locations on the substrate according to the overlay correction pattern resulting in a modified bow of the substrate. The substrate with the modified bow has a second overlay error. The second overlay error has reduced overlay error as compared to the initial overlay error. Other techniques can also be used to identify locations on a substrate to correct both with compensatory internal stresses. A particular stress-correction layer can have abrupt transitions between materials of different internal stresses (for example, compressive to tensile interface. Techniques in the present disclosure, however, provide gradual transitions between materials of different internal stresses. Interface transitions herein can be formed with different interface slopes. A steeper slope will have a shorter transition, while a shallow slope will have a gradual transition. Location-specific developing of films and vertical acid diffusion lengths can be used to pattern sloped transitions of stress-correcting films.

Techniques herein can further enhance the subject matter of U.S. patent application Ser. No. 15/695,966 entitled "Location-Specific Tuning of Stress to Control Bow to Control Overlay In Semiconductor Processing," which is herein incorporated by reference in its entirety.

Techniques disclosed in the present disclosure provide methods for tuning transitions of films on a substrate by using location-specific development of films to provide gradual transitions between films of different internal stresses. This can include using a direct-write projection system with exposure control by location including varying intensity at various locations. A solubility-changing agent, such as a photo acid generator, and be deposited on a given developable film. Light from a patterned exposure can generate more or less acid at coordinate locations. With a bake step, acid generated can be diffused into the underlying film a predetermined depth. The depth is a function of amount of acid generated from an amount or intensity of radiation exposure, as well as bake time and temperature.

For example, a substrate has a film with a photo-acid generator, or an acid coat or other agent coat is deposited on a developable layer. A given location on the substrate receives 100% of available radiation, another location receives 50% of available radiation, and another location receives no radiation. At the location receiving no radiation there is no acid diffusion. At the location receiving 50% of the radiation energy (or energy equal to half of solubility-changing compound that can be generated), a solubility-changing agent is diffused into the layer a first depth. At the location receiving 100% of available radiation, the solubility-changing agent is diffused into the layer a second depth that is twice as deep as the first depth. Accordingly, the layer is made soluble to different depths according to dosage and baking. During a development step, different amounts of material are removed.

By making a transitional or fade exposure across particular transition regions, a physical slope in a given material can be formed. The action on a substrate from a given film is a function of its internal stress and thickness at a given location. Thus by having gradual changes in thicknesses at stress boundary regions, graduated stress transitions are herein provided to a corresponding substrate.

FIGS. 1-11 show various cross-sectional formations during a plurality of steps of a stress tuning process according to aspects of the present disclosure.

FIG. 1 shows a cross-sectional formation during one of the plurality of steps of the stress tuning process according to an aspect of the present disclosure. As shown in formation 101 of FIG. 1, a substrate 110 may be provided. The substrate 101 may be is mounted on a chuck, also referred to as a wafer table.

Figure 2:
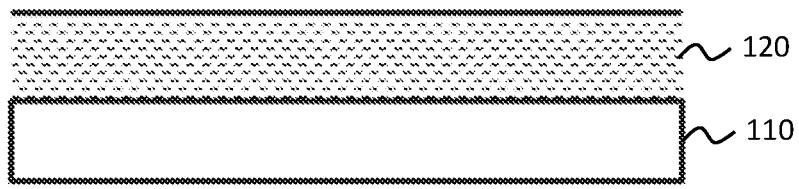
FIG. 2 shows a cross-sectional formation during one of the plurality of steps of the stress tuning process according to an exemplary aspect of the present disclosure.

FIG. 2 shows a cross-sectional formation during one of the plurality of steps of the stress tuning process according to an aspect of the present disclosure. As shown in formation 102 of FIG. 2, a film may be coated or deposited on the substrate 110 to form a first layer 120 of a first material A. For example, the first layer 120 may be formed by spin-on, chemical vapor deposition (CVD), atomic layer deposition (ALD), imprint, roller, tube squeeze, spray, jet print, or any suitable method of coating or depositing a film on the substrate 110. The first material A may be one or a combination of SoC, PR, SiARC, SiO, SiN, HfO, TiO, AlO, TiN, or any other suitable material. The first layer 120 can cover the substrate 110 may have a top surface that is planar. Further, it should be noted that the side of the substrate 101 where the first layer 120 is deposited may be the back side surface of the substrate 101, which is opposite to a front side surface of the substrate 101 that may include semiconductor devices.

Figure 3:
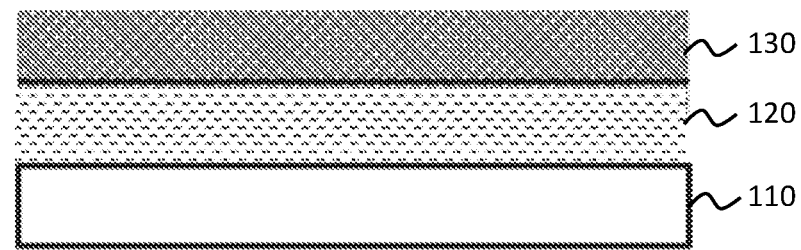
FIG. 3 shows a cross-sectional formation during one of the plurality of steps of the stress tuning process according to an exemplary aspect of the present disclosure.

FIG. 3 shows a cross-sectional formation during one of the plurality of steps of the stress tuning process according to an aspect of the present disclosure. As shown in formation 103 of FIG. 3, a second layer 130 of a second material B may then be deposited on the first layer 120. The second layer 130 may be a film providing a desired stress, or the second layer 130 may be a patterning layer to define a sloped transition discussed later. For example, the second layer 130 may be formed by spin-on, chemical vapor deposition (CVD), imprint, roller, tube squeeze, spray, jet print, or any suitable method of coating or depositing a film on the first layer 120. The second material B may be one or a combination of Acid Sensitive Polymer PTD PR, Acid Sensitive Polymer NTD PR, Acid Sensitive Polymer DARC, Acid Sensitive Polymer DBARC, Acid Sensitive monomer acid catalyst crosslinking (H+), or any other suitable material. The second layer 130 may have a top surface that is planar. Material A of the first layer 120 and material B of the second layer 130 may be selected to directly amplify a magnitude of z-height control. For example, the materials can be selected so that material A has a greater etch rate compared to material B.

A solubility of the second layer 130 may be changed by coordinate location on the substrate 110. Furthermore, the solubility of the second layer 130 may be changed in solubility from a top surface of the second layer 130 down a predetermined depth into the second layer 130 at each coordinate location. Changing the solubility of the second layer 130 can include creating a transition region defining a predetermined slope of solubility change across the transition region. This can be created by graduated actinic radiation exposure.

Figure 4:
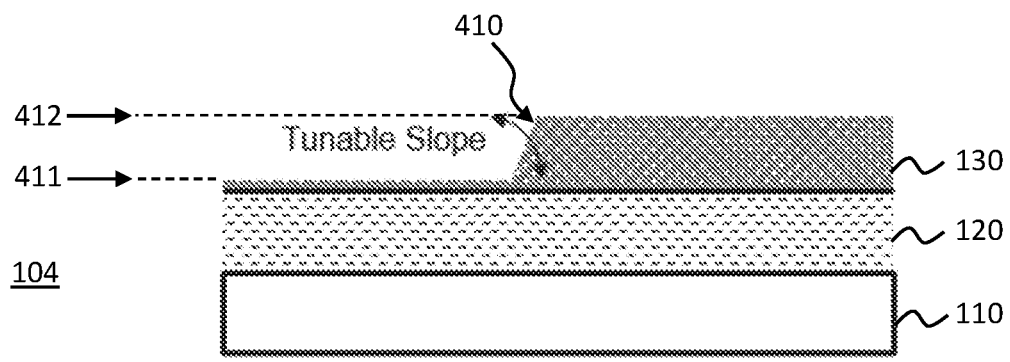
FIG. 4 shows a cross-sectional formation during one of the plurality of steps of the stress tuning process according to an exemplary aspect of the present disclosure.

FIG. 4 shows a cross-sectional formation during one of the plurality of steps of the stress tuning process according to an aspect of the present disclosure. As shown in formation 104 of FIG. 4, soluble portions of the second layer 130 may be removed using a specific developer. Remaining portions of the second layer 130 may have a slope 410 in the transition region from a first z-height 411 of the second layer 130 to a second z-height 412 of the second layer 130. The first z-height 411 of the second layer 130 may be less than the second z-height 412 of the second layer 130. An angle of the slope 410 may be selected and then a corresponding light exposure may provide grayscale exposure to yield the desired slope 410. Selecting the angle of the slope 410 provides the ability to tune stress transitions in the various layers on the substrate 110. The selected angle of the slope 410 may be greater than zero degrees and less than 90 degrees, or greater than 15 degrees and less than 75 degrees, or any other suitable angle value that is appropriate to facilitate the stress transition between neighboring materials in the resulting formation.

Figure 5A:
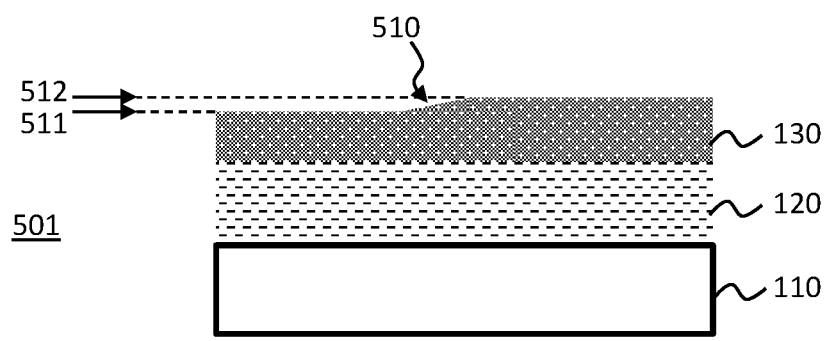
FIG. 5A shows a cross-sectional formation based on a selection of a specific slope angle according to an exemplary aspect of the present disclosure.
Figure 5B:
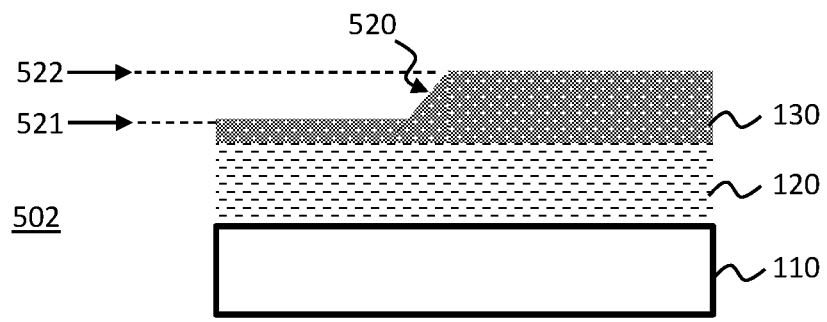
FIG. 5B shows a cross-sectional formation based on a selection of a specific slope angle according to an exemplary aspect of the present disclosure.
Figure 5C:
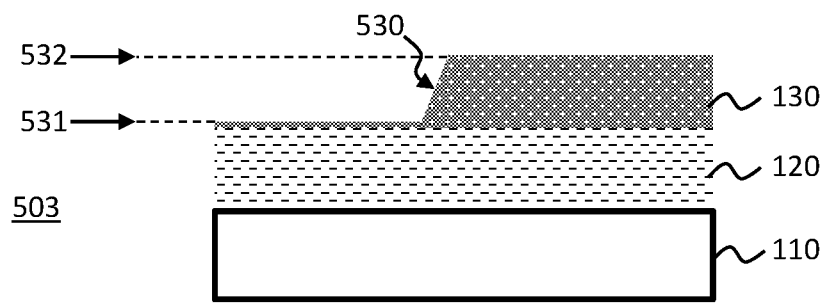
FIG. 5C shows a cross-sectional formation based on a selection of a specific slope angle according to an exemplary aspect of the present disclosure.

FIGS. 5A, 5B and 5C show examples of cross-sectional formations based on selections of different slope angles of the tunable slope in the transition region between varieties of z-heights according to aspects of the present disclosure.

As shown in formation 501 of FIG. 5A, soluble portions of the second layer 130 may be removed such that remaining portions of the second layer 130 may have a slope 510 in the transition region from a first z-height 511 of the second layer 130 to a second z-height 512 of the second layer 130. The first z-height 511 may be slightly less than the second z-height 512, and an angle of the slope 510 may be relatively shallow. For example, a height difference between the first z-height 511 and the second z-height 512 may be between 1% and 30% of the film thickness of the second layer 130 (i.e., $\Delta h = 1\%$ to $30\%$), and the angle of the slope 510 may be less than or equal to 30° (i.e., $\Theta \leq 30°$).

As shown in formation 502 of FIG. 5B, soluble portions of the second layer 130 may be removed such that remaining portions of the second layer 130 may have a slope 520 in the transition region from a first z-height 521 of the second layer 130 to a second z-height 522 of the second layer 130. The first z-height 521 may be moderately less than the second z-height 522, and an angle of the slope 520 may be relatively intermediate. For example, a height difference between the first z-height 521 and the second z-height 522 may be between 30% and 70% of the film thickness of the second layer 130 (i.e., Δh=30% to 70%), and the angle of the slope 520 may be between 30° and 60° (i.e., 30°<Θ<60°).

As shown in formation 503 of FIG. 5C, soluble portions of the second layer 130 may be removed such that remaining portions of the second layer 130 may have a slope 530 in the transition region from a first z-height 531 of the second layer 130 to a second z-height 532 of the second layer 130. The first z-height 531 may be significantly less than the second z-height 532, and an angle of the slope 530 may be relatively steep. For example, a height difference between the first z-height 531 and the second z-height 532 may be between 70% and 100% of the film thickness of the second layer 130 (i.e., Δh=70% to 100%), and the angle of the slope 530 may be between 60° and 90° (i.e., 60°<Θ<90°).

In addition to the aforementioned examples of different slope transitions in FIGS. 5A, 5B and 5C, other slope transitions having slopes with angles varying between very shallow to very steep may be formed in the second layer 130.

Figure 6:
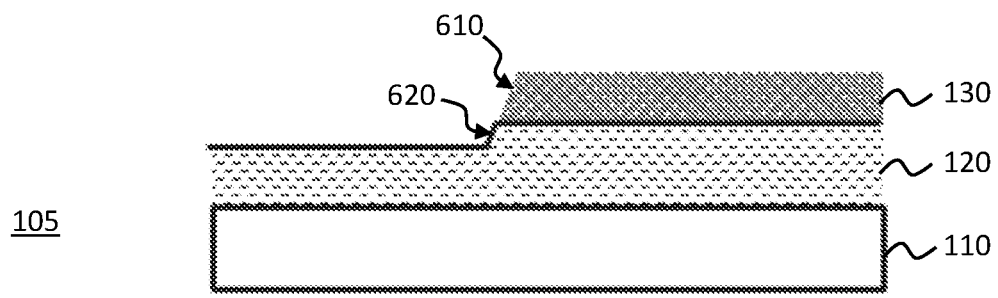
FIG. 6 shows a cross-sectional formation during one of the plurality of steps of the stress tuning process according to an exemplary aspect of the present disclosure.

FIG. 6 shows a cross-sectional formation during one of the plurality of steps of the stress tuning process according to an aspect of the present disclosure. As previously mentioned, the second layer 130 may be a film providing a desired stress and can function as a first stress-controlled film. The second layer 130 may also be a patterning layer to define the sloped transition. Some desired stress-tuning materials may not be developable and so a developable layer may be first patterned. As shown in formation 105 of FIG. 6, an etch process may be executed that simultaneously etches the first material of the first layer 120 and the second material of the second layer 130. This etch process transfers the slope 410 formed in the formation 104 of the second layer 130 into the first layer 120 resulting in a formation of a slope 610 in the second layer 130 and a slope 620 in the first layer 120. More specifically, the first and second materials of the respective first and second layers 120, 130 may be etched at an equivalent rate such that the angle of the slope in the transition region from the second layer 130 may be transferred in to the first layer 120.

Figure 7:
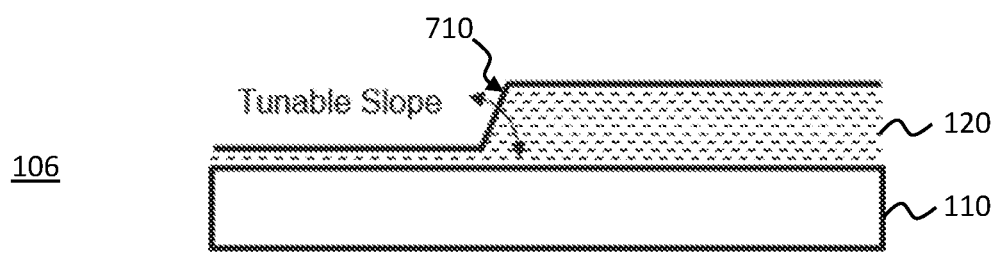
FIG. 7 shows a cross-sectional formation during one of the plurality of steps of the stress tuning process according to an exemplary aspect of the present disclosure.

FIG. 7 shows a cross-sectional formation during one of the plurality of steps of the stress tuning process according to an aspect of the present disclosure. Specifically, FIG. 7 shows formation 106, which is an example result after the etch process transfers the slope from the second layer 130 in to the first layer 120, completing the pattern transfer shown in formation 105. As shown in FIG. 7, the second layer 130 may be fully removed and its slope may be fully transferred in to the first layer 120 so as to form slope 710 in the first layer 120. The first layer 120 can provide a tensile or compressive stress and have a gradual reduction in stress at the sloped region having slope 710. In other words, the pull or push on the wafer from this film gradually fades at sloped regions, which provides the technical advantage of smooth stress transitions of films on the substrate 110.

Figure 8:
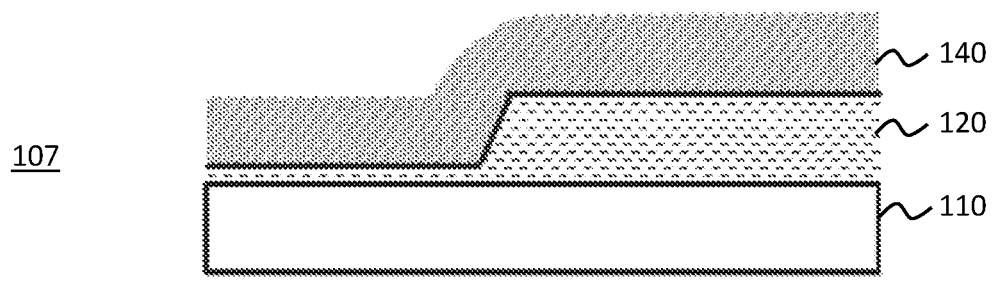
FIG. 8 shows a cross-sectional formation during one of the plurality of steps of the stress tuning process according to an exemplary aspect of the present disclosure.

After forming a film with an internal stress and sloped transition regions, as shown in FIG. 7, more films may be added. FIG. 8 shows a cross-sectional formation during one of the plurality of steps of the stress tuning process according to an aspect of the present disclosure. Specifically, as shown in formation 107 of FIG. 8, a third layer 140 of a third material C may be deposited on the first layer 120 and portions of the revealed substrate 110 so as to form a second stress-control-film and provide a desired stress. For example, the third layer 140 may be formed by spin-on, chemical vapor deposition (CVD), atomic layer deposition (ALD), imprint, roller, tube squeeze, spray, jet print, or any suitable method of coating or depositing a film on the first layer 120 and the substrate 110. The third material C may be one or a combination of SoC, PR, SiARC, SiO, SiN, HfO, TiO, AlO, TiN, or any other suitable material. The third material C of the third layer 140 may be deposited just in openings or areas without the first material A, and deposited just to a top surface of the first layer 120. The third material C of the third layer 140 may also be deposited conformally and then planarized. FIG. 8 shows a conformal deposition of the third layer 140.

Figure 9:
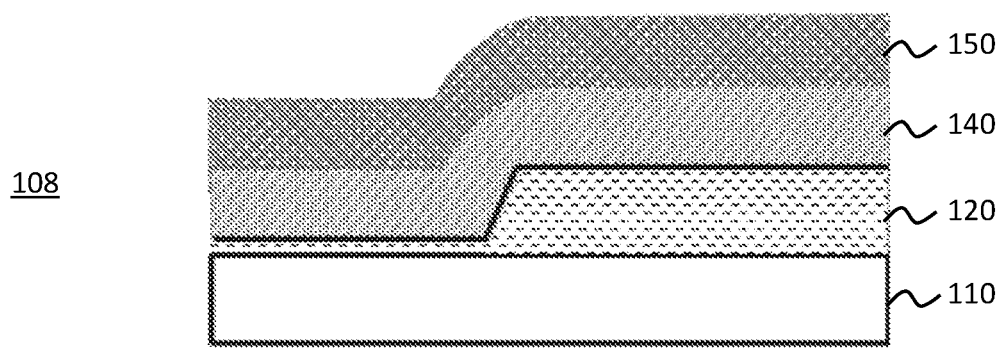
FIG. 9 shows a cross-sectional formation during one of the plurality of steps of the stress tuning process according to an exemplary aspect of the present disclosure.

FIG. 9 shows a cross-sectional formation during one of the plurality of steps of the stress tuning process according to an aspect of the present disclosure. Specifically, as shown in formation 108 of FIG. 9, a fourth layer 150 of a fourth material D may be deposited on the third layer 140. The fourth material D may be developable. For example, the fourth layer 150 may be formed by spin-on, chemical vapor deposition (CVD), imprint, roller, tube squeeze, spray, jet print, or any suitable method of coating or depositing a film on the third layer 140. The fourth material D may be one or a combination of Acid Sensitive Polymer PTD PR, Acid Sensitive Polymer NTD PR, Acid Sensitive Polymer DARC, Acid Sensitive Polymer DBARC, Acid Sensitive monomer acid catalyst crosslinking (H+), or any other suitable material. The fourth material D may then be exposed in areas of greater z-height to change a solubility of the fourth layer 150 either directly or after vertical diffusion of a solubility-shifting agent.

Figure 10:
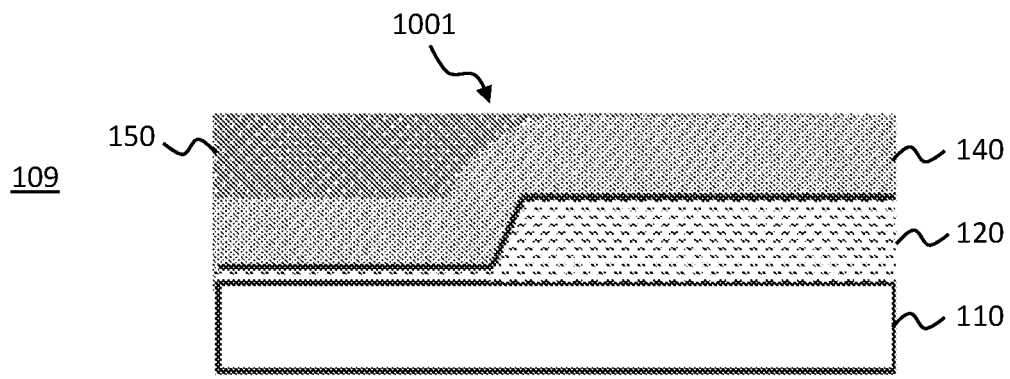
FIG. 10 shows cross-sectional formations during various steps in a cyclical planarization process according to an exemplary aspect of the present disclosure.

FIG. 10 shows a cross-sectional formation during one of the plurality of steps of the stress tuning process according to an aspect of the present disclosure. Specifically, after rendering a top portion of the fourth layer 150 soluble, the soluble portions of the fourth material D of the fourth layer 150 may then be developed to be removed. As shown in formation 109 of FIG. 10, the removal of the soluble portions of the fourth material D of the fourth layer 150 may result in a planarized top surface 1001.

Figure 11:
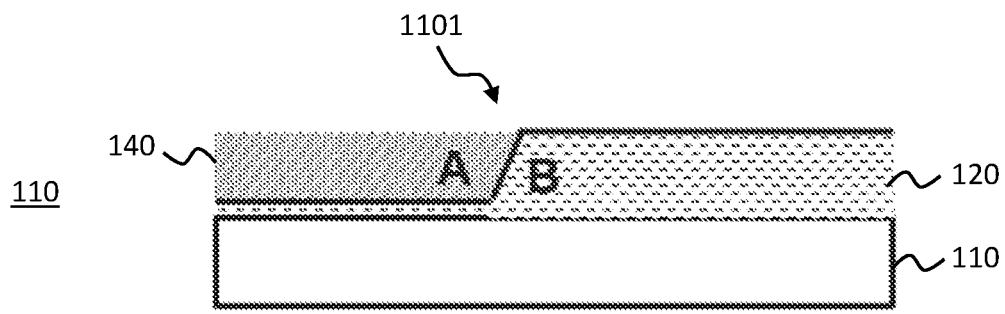
FIG. 11 shows a cross-sectional formation during one of the plurality of steps of the stress tuning process according to an exemplary aspect of the present disclosure.

FIG. 11 shows a cross-sectional formation during one of the plurality of steps of the stress tuning process according to an aspect of the present disclosure. As shown in formation 110 of FIG. 11, the third and fourth materials C, D of the third and fourth layers 140, 150, respectively, may then be planarized to leave just the first and third materials A, C of the respective first and third layers 120, 140. In particular, the third and fourth materials C, D of the respective third and fourth layers 140, 150 may have an equivalent etch rate with a particular etch chemistry such that the third and fourth layers 140, 150 can be etched until uncovering the first and third materials A, C of the respective first and third layers 120, 140, leaving a planar surface. A chemical-mechanical polishing step could alternatively be used to planarize the surface to reveal the first layer 120. The resulting formation 110 includes a planarized top surface 1101 of the first and third layers 120, 140 with a sloped interface therebetween.

The first and third materials A, C of the respective first and third layers 120 and 140 may have a same molecular composition, but have different stresses due to their respective molecular structures or due to how the materials were deposited. The resulting stress-correction layer of formation 110 of FIG. 11 may be comprised of regions of compressive silicon nitride in the third material C of the third layer 140 and regions of tensile silicon nitride in the first material A of the first layer 120. Other embodiments can have areas of low tensile stress material and areas of high tensile stress material. The sloped interface between compressive and tensile materials provides a smoother transition between areas of push and pull.

Figure 12A:
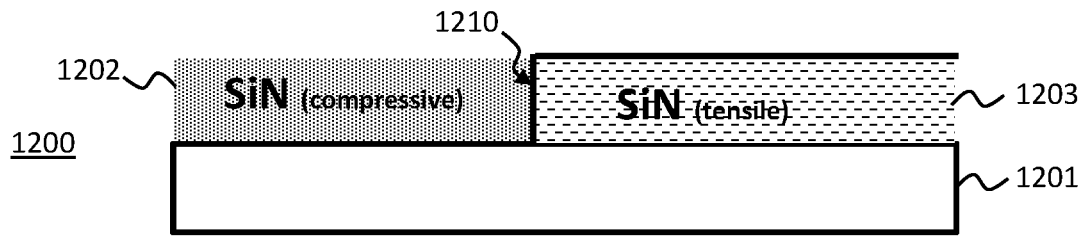
FIG. 12A shows a cross-sectional formation according to an exemplary aspect of the present disclosure.

FIG. 12A shows a cross-sectional formation according to an aspect of the present disclosure. As shown in FIG. 12A, formation 1200 may include a substrate 1201 having deposited thereon a first layer 1202 of compressive material and a second layer 1203 of tensile material. The formation 1200 may include an interface 1210 between the first and second layers 1202, 1203. The first layer 1202 and the second layer 1203 may correspond to the third layer 140 and the first layer 120, respectively, as shown in FIG. 11 and may be formed by a similar stress tuning process that resulted in the formation 110, with the exception of the interface 1210, which differs from the tunable slope 710. The interface 1210 may be formed by changing the solubility of specific layers to create the slope of the interfaces defining the transition region across the materials. The interface 1210 includes a steep vertical slope and constitutes an abrupt stress transition between neighboring materials of the first and second layers 1202, 1203 without graduation in the transition.

Figure 12B:
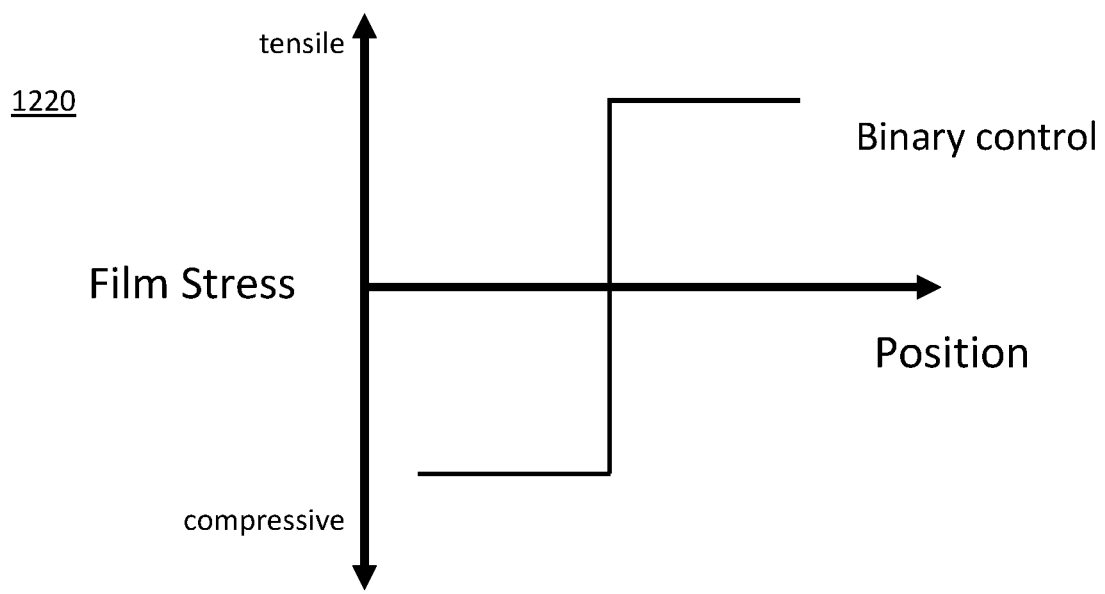
FIG. 12B shows a film stress graph of the formation shown in FIG. 12A according to an exemplary aspect of the present disclosure.

FIG. 12B shows a film stress graph of the formation shown in FIG. 12A according to an aspect of the present disclosure. The film stress graph 1220 includes a y-axis representing film stress that ranges from compressive to tensile, and an x-axis representing position in a horizontal direction along a surface of the substrate 1201 from the first layer 1202 towards the second layer 1203. As shown in the film stress graph 1220, only binary control is provided as stresses jump from compressive in the first layer 1202 to tensile in the second layer 1203.

Figure 13A:
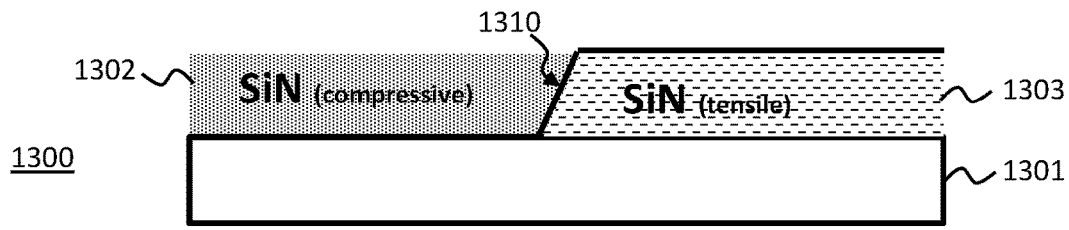
FIG. 13A shows a cross-sectional formation according to an aspect of the present disclosure.

FIG. 13A shows a cross-sectional formation according to an aspect of the present disclosure. As shown in FIG. 13A, formation 1300 may include a substrate 1301 having deposited thereon a first layer 1302 of compressive material and a second layer 1303 of tensile material. The formation 1300 may include an interface 1310 between the first and second layers 1302, 1303. The first layer 1302 and the second layer 1303 may correspond to the third layer 140 and the first layer 120, respectively, as shown in FIG. 11 and may be formed by a similar stress tuning process that resulted in the formation 110, with the exception of the interface 1310, which differs slightly from the tunable slope 710. The interface 1310 may be formed by changing the solubility of specific layers to create the slope of the interfaces defining the transition region across the materials. The interface 1310 includes a moderate slope and facilitates a gradual stress transition between neighboring materials of first and second layers 1302, 1303.

Figure 13B:
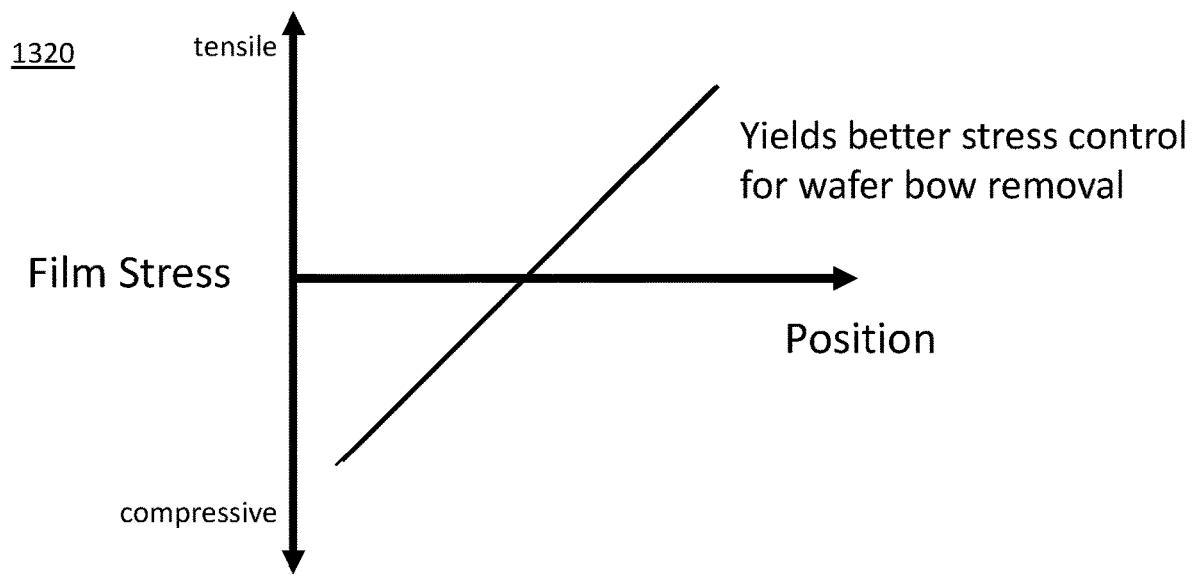
FIG. 13B shows a film stress graph of the formation shown in FIG. 13A according to an exemplary aspect of the present disclosure.

FIG. 13B shows a film stress graph of the formation shown in FIG. 13A. The film stress graph 1320 includes a y-axis representing film stress that ranges from compressive to tensile, and an x-axis representing position in a horizontal direction along a surface of the substrate 1301 from the first layer 1302 towards the second layer 1303. As shown in the film stress graph 1320, gradual control is provided as stresses transition from compressive in the first layer 1302 to tensile in the second layer 1303. The moderate slope of the interface 1310 provides a sloped material transition between stress-control materials, thus yielding better stress control for wafer bow removal/correction.

Figure 14A:
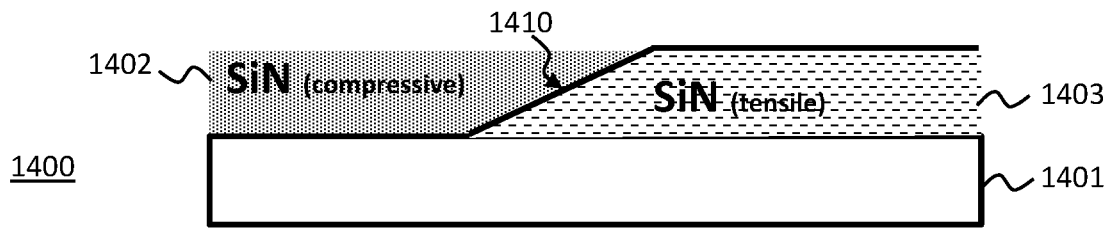
FIG. 14A shows a cross-sectional formation according to an exemplary aspect of the present disclosure.

FIG. 14A shows a cross-sectional formation according to an aspect of the present disclosure. As shown in FIG. 14A, formation 1400 may include a substrate 1401 having deposited thereon a first layer 1402 of compressive material and a second layer 1403 of tensile material. The formation 1400 may include an interface 1410 between the first and second layers 1402, 1403. The first layer 1402 and the second layer 1403 may correspond to the third layer 140 and the first layer 120, respectively, as shown in FIG. 11 and may be formed by a similar stress tuning process that resulted in the formation 110, with the exception of the interface 1410, which differs from the tunable slope 710. The interface 1410 may be formed by changing the solubility of specific layers to create the slope of the interfaces defining the transition region across the materials. The interface 1410 includes a shallow slope and constitutes a significantly gradual stress transition between neighboring materials of first and second layers 1402, 1403.

Figure 14B:
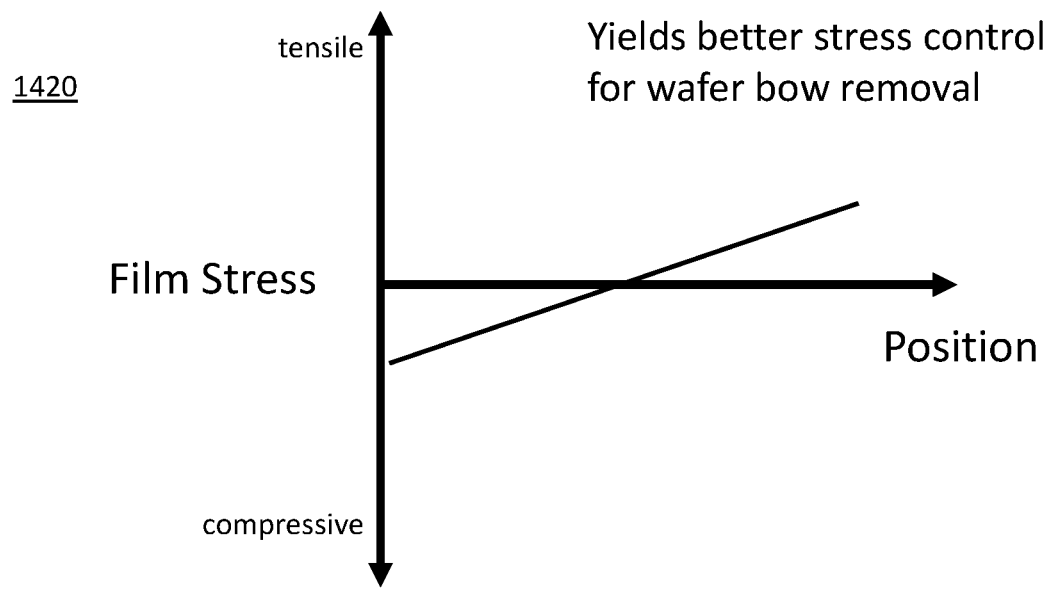
FIG. 14B shows a film stress graph of the formation shown in FIG. 14A according to an exemplary aspect of the present disclosure.

FIG. 14B shows a film stress graph of the formation shown in FIG. 14A. The film stress graph 1420 includes a y-axis representing film stress that ranges from compressive to tensile, and an x-axis representing position in a horizontal direction along a surface of the substrate 1401 from the first layer 1402 towards the second layer 1403. As shown in the film stress graph 1420, gradual control is provided as stresses transition from compressive in the first layer 1402 to tensile in the second layer 1403. The shallow slope of the interface 1410 provides a sloped material transition between stress-control materials, thus yielding better stress control for wafer bow removal/correction.

Figure 15A:
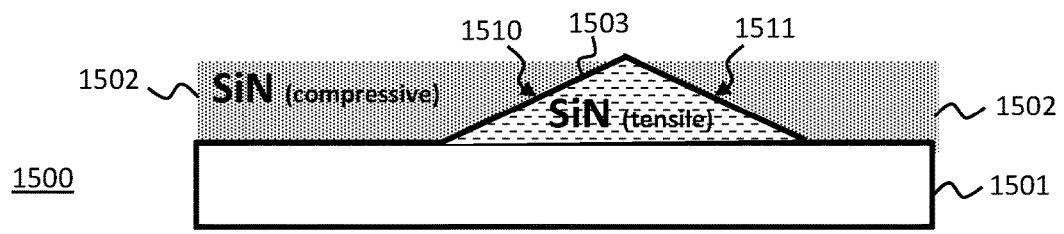
FIG. 15A shows a cross-sectional formation according to an exemplary aspect of the present disclosure.

FIG. 15A shows a cross-sectional formation according to an aspect of the present disclosure. As shown in FIG. 15A, formation 1500 may include a substrate 1501 having deposited thereon a first layer 1502 of compressive material and a second layer 1503 of tensile material. The first layer 1502 may be provided on either side of the second layer 1503. The formation 1500 may include interfaces 1510, 1511 between the first and second layers 1502, 1503 on either side of the second layer 1503. The first layer 1502 and the second layer 1503 may correspond to the third layer 140 and the first layer 120, respectively, as shown in FIG. 11 and may be formed by a similar stress tuning process that resulted in the formation 110, with the exception of the interfaces 1510 and 1511, which differ from the tunable slope 710. The interfaces 1510 and 1511 may be formed by changing the solubility of specific layers to create the slope of the interfaces defining the transition region across the materials. The interfaces 1511 and 1510 both include a shallow slope and constitute a first stress transition and a second stress transition between neighboring materials of first and second layers 1502, 1503 with a significantly gradual transition from compressive to tensile, and from tensile to compressive.

Figure 15B:
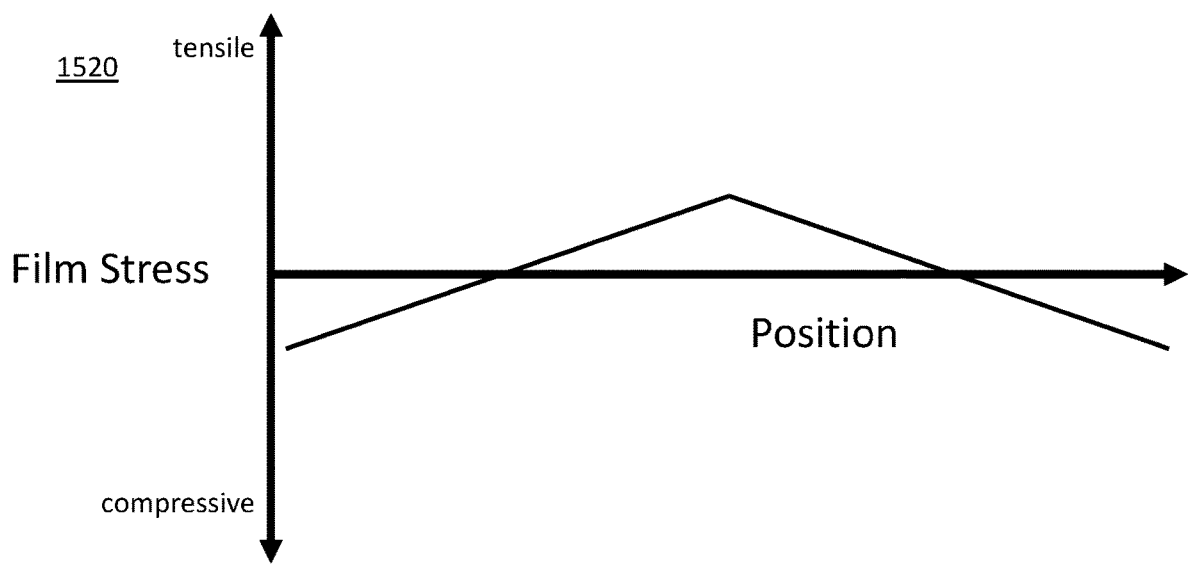
FIG. 15B shows a film stress graph of the formation shown in FIG. 15A according to an exemplary aspect of the present disclosure.

FIG. 15B shows a film stress graph of the formation shown in FIG. 15A. The film stress graph 1520 includes a y-axis representing film stress that ranges from compressive to tensile, and an x-axis representing position in a horizontal direction along a surface of the substrate 1501 from the first layer 1502 towards the second layer 1503 across the interface 1510, and from the second layer 1503 towards the first layer 1502 across the interface 1511. As shown in the film stress graph 1520, gradual control is provided as stresses transition from compressive in the first layer 1502 to tensile in the second layer 1503 across the interface 1510 (first stress transition) and then back to compressive in the first layer 1502 across the interface 1511 (second stress transition). The shallow slope of the interfaces 1510 and 1511 provides a sloped material transition between stress-control materials, thus yielding better stress control for wafer bow removal/correction.

In view of the aforementioned description, the stress tuning process and aforementioned techniques provide gradual stress transitions by location on a substrate to improve stress control for a flatter substrate or a substrate with less overlay error.

Figure 16:
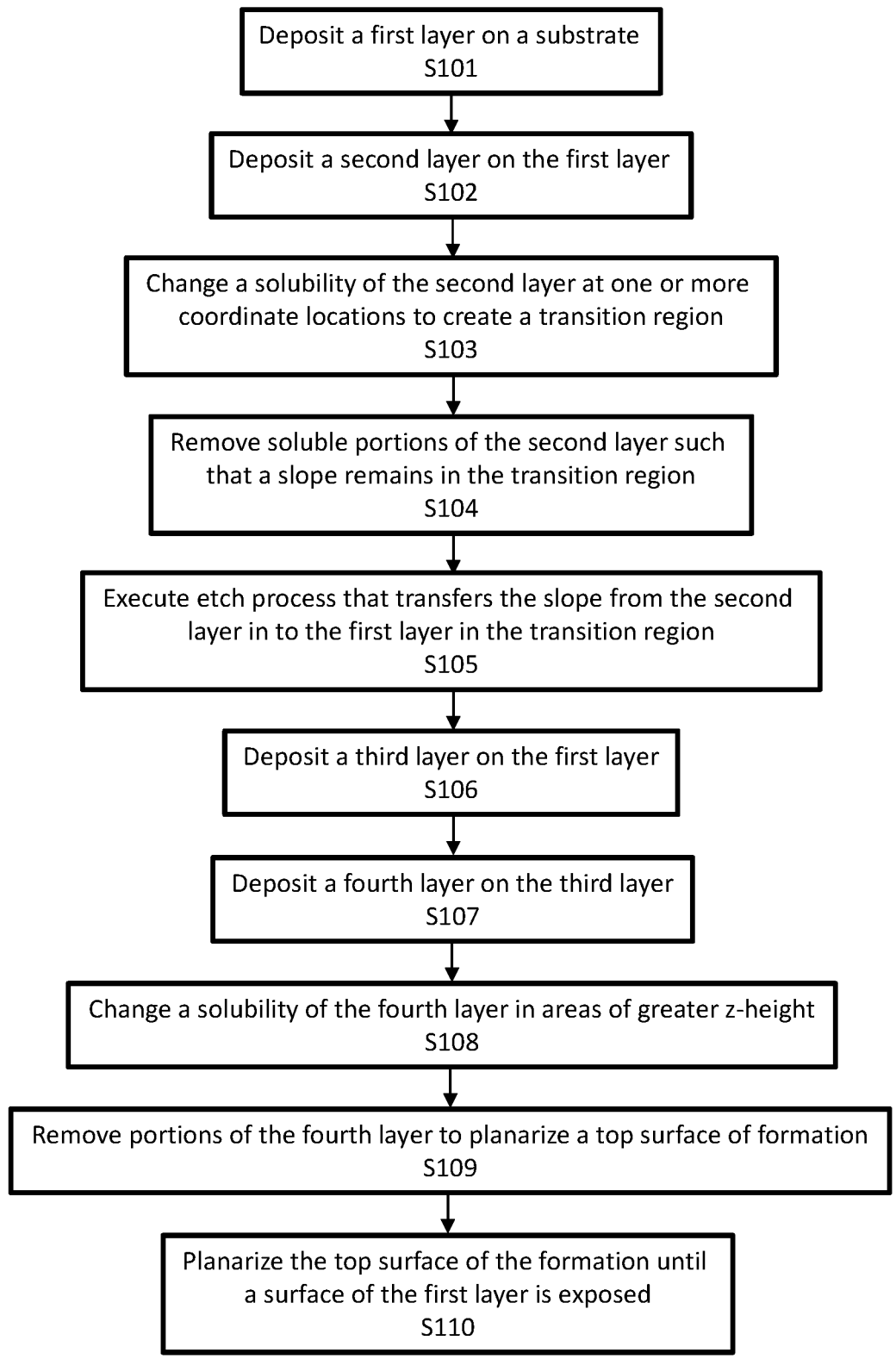
FIG. 16 shows a flow chart for a method of stress tuning a substrate according to an exemplary aspect of the present disclosure.

FIG. 16 shows a flow chart for a method of stress tuning a substrate according to an exemplary aspect of the present disclosure. In step S101, a first layer is deposited on the substrate. For example, as shown in FIG. 2, a film may be coated or deposited on the substrate 110 to form a first layer 120 of a first material A.

In step S102, a second layer is deposited on the first layer. For example, as shown in FIG. 3, a second layer 130 of a second material B may be deposited on the first layer 120.

In step S103, a solubility of the second layer is changed at one or more coordinate locations to create a transition region. For example, the solubility of the second layer 130 may be changed in solubility from a top surface of the second layer 130 down a predetermined depth into the second layer 130 at each coordinate location.

In step S104, soluble portions of the second layer are removed such that a slope remains in the transition region. For example, as shown in FIG. 4, soluble portions of the second layer 130 may be removed using a specific developer. Remaining portions of the second layer 130 may have a slope 410 in the transition region from a first z-height 411 of the second layer 130 to a second z-height 412 of the second layer 130. The angle of the slope 410 is predetermined and may differ based on the desired resultant stress transition, as exemplified in FIGS. 5A, 5B and 5C.

In step S105, an etch process is executed that transfers the slope form the second layer in to the first layer in the transition region. For example, as shown in FIG. 6, an etch process may be executed that simultaneously etches the first material of the first layer 120 and the second material of the second layer 130. This etch process transfers the slope 410 formed in the formation 104 of the second layer 130 into the first layer 120 resulting in a formation of a slope 610 in the second layer 130 and a slope 620 in the first layer 120. Furthermore, as shown in FIG. 7, the second layer 130 may be fully removed and its slope may be fully transferred in to the first layer 120 so as to form slope 710 in the first layer 120.

In step S106, a third layer is deposited on the first layer. For example, as shown in FIG. 8, a third layer 140 of a third material C may be deposited on the first layer 120 and portions of the revealed substrate 110 so as to form a second stress-control-film and provide a desired stress.

In step S107, a fourth layer is deposited on the third layer. For example, as shown in FIG. 9, a fourth layer 150 of a fourth material D may be deposited on the third layer 140.

In step S108, a solubility of the fourth layer is changed in areas of greater z-height. For example, a top portion of the fourth layer 150 may be rendered soluble in areas of greater z-height.

In step S109, portions of the fourth layer are removed to planarize a top surface of the formation. For example, as shown in FIG. 10, the soluble portions of the fourth layer 150 may be developed to be removed such that the removal of the soluble portions of the fourth layer 150 results in a planarized top surface 1001.

In step S110, the top surface of the formation is planarized until a surface of the first layer is exposed. For example, as shown in FIG. 11, the third and fourth layers 140, 150 may be planarized to leave just the first and third layers 120 and 140. The resulting formation 110 includes a planarized top surface 1101 of the first and third layers 120, 140 with a sloped interface therebetween.

In this manner, the disclosed method of stress tuning can be used to effectively create gradual stress transitions by location on a substrate to improve stress control for a flatter substrate or a substrate with less overlay error.

In the preceding description, specific details have been set forth, such as a particular geometry of a processing system and descriptions of various components and processes used therein. It should be understood, however, that techniques herein may be practiced in other aspects that depart from these specific details, and that such details are for purposes of explanation and not limitation. Aspects disclosed herein have been described with reference to the accompanying drawings. Similarly, for purposes of explanation, specific numbers, materials, and configurations have been set forth in order to provide a thorough understanding. Nevertheless, aspects may be practiced without such specific details. Components having substantially the same functional constructions are denoted by like reference characters, and thus any redundant descriptions may be omitted.

Various techniques have been described as multiple discrete operations to assist in understanding the various aspects. The order of description should not be construed as to imply that these operations are necessarily order dependent. Indeed, these operations need not be performed in the order of presentation. Operations described may be performed in a different order than the described aspect. Various additional operations may be performed and/or described operations may be omitted in additional aspects.

"Substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of aspects of the disclosure are not intended to be limiting. Rather, any limitations to aspects of the disclosure are presented in the following claims.

What is claimed is:

1. A method of adjusting stress on a substrate, the method comprising:

depositing a first layer of a first material on the substrate;

depositing a second layer of a second material on the first layer, wherein the first layer and the second layer are deposited on a backside surface of the substrate opposing a front side surface of the substrate, the front side surface of the substrate including semiconductor devices;

changing a solubility of the second layer at one or more coordinate locations on the substrate, wherein the solubility of the second layer is changed in solubility from a top surface of the second layer down to a predetermined depth into the second layer at each of the one or more coordinate locations, and wherein changing the solubility of the second layer includes creating a transition region defining a predetermined vertical acid diffusion length across the transition region; and removing soluble portions of the second layer using a developer such that remaining portions of the second layer include a predetermined physical slope in the transition region from the top surface of the second layer down to the predetermined depth into the second layer, wherein the predetermined physical slope is greater than 15 degrees and less than 75 degrees, and wherein the first material and the second material have a same molecular composition and different internal stresses.

2. The method of claim 1, further comprising:
executing an etch process that simultaneously etches the first material and the second material transferring the predetermined physical slope into the first layer.

3. The method of claim 2, further comprising:
depositing a third material on the substrate resulting in a planar surface of the substrate, the third material filling regions of the substrate to a greatest vertical height of the first layer from the backside surface of the substrate.

4. The method of claim 3, wherein the first material has a different internal stress as compared to the third material.

5. The method of claim 1, wherein changing the solubility of the second layer includes creating a second transition region defining a second predetermined vertical acid diffusion length across the second transition region.

6. The method of claim 1, further comprising:
depositing a third material on the substrate resulting in a planar surface of the substrate, the third material filling regions of the substrate to a greatest vertical height of the second layer from the backside surface of the substrate.

7. The method of claim 1, further comprising:
depositing a third material on the substrate; and
planarizing the substrate to remove an overburden of the third material, the third material having the predetermined physical slope in the transition region.

8. The method of claim 1, wherein creating the transition region defining the predetermined vertical acid diffusion length is based on a desired stress transition for the transition region.

9. The method of claim 1, further comprising:
depositing a third material on the substrate, the third material filling regions of the substrate having a lesser vertical height from the backside surface of the substrate;
depositing a fourth material on the substrate, the fourth material filling regions of the substrate having a lesser vertical height from the backside surface of the substrate; and
planarizing the fourth material by changing a solubility of the fourth material at locations of relatively greater vertical height from the backside surface of the substrate, and removing soluble portions of the fourth material using a developer.

10. The method of claim 1, wherein the predetermined physical slope is selected based on a design stress transition.

11. A method of adjusting stress on a substrate, the method comprising:
depositing a first layer of a first material on the substrate, wherein the first layer is deposited on a backside surface of the substrate opposing a front side surface of the substrate, the front side surface of the substrate including semiconductor devices;

changing a solubility of the first layer at one or more coordinate locations on the substrate, wherein the solubility of the first layer is changed in solubility from a top surface of the first layer down a predetermined depth into the first layer at each of the one or more coordinate locations, and wherein changing the solubility of the first layer includes creating a transition region defining a predetermined vertical acid diffusion length across the transition region;

removing soluble portions of the first layer using a specific developer such that remaining portions of the first layer include a predetermined physical slope based on the predetermined vertical acid diffusion length in the transition region from the top surface of the first layer down to the predetermined depth into the first layer, the predetermined physical slope being greater than 15 degrees and less than 75 degrees; and depositing a second layer of a second material on the substrate, the second material forming an interface with the first material having the predetermined physical slope, the second material and the first material having a same molecular composition and different internal stresses.

12. A method of adjusting stress on a substrate, the method comprising:
forming a stress-adjustment layer on the substrate, wherein the stress-adjustment layer includes first regions formed of a first material and second regions formed of a second material, wherein the first material includes a first internal stress and the second material includes a second internal stress, and wherein the first internal stress is different compared to the second internal stress; and forming transition regions between the first regions and the second regions, wherein the transition regions include an interface between the first material and the second material that has a predetermined physical slope that is greater than 15 degrees and less than 75 degrees and that is continuous from a top of the stress-adjustment layer down to a predetermined depth into the stress-adjustment layer, wherein the predetermined physical slope of the interface separates the first material and the second material in a planar view parallel to a surface of the substrate, and wherein the first material and the second material have a same molecular composition and different internal stresses.

13. The method of claim 12, further comprising forming transition regions of different interface physical slopes based on a coordinate location on the substrate.

14. The method of claim 12, wherein the first internal stress is a compressive stress, and the second internal stress is a compressive stress, or
wherein the first internal stress is a tensile stress, and the second internal stress is a tensile stress.

15. The method of claim 12, wherein the first internal stress is a compressive stress, and the second internal stress is a tensile stress.

* * * * *